United States Patent
Tsuda et al.

(10) Patent No.: US 9,959,957 B2
(45) Date of Patent: May 1, 2018

(54) RESISTOR AND METHOD FOR MANUFACTURING SAME

(71) Applicant: Panasonic Intellectual Property Management Co., Ltd., Osaka (JP)

(72) Inventors: Seiji Tsuda, Fukui (JP); Shogo Nakayama, Fukui (JP); Takeshi Iseki, Nara (JP); Kazutoshi Matsumura, Fukui (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 83 days.

(21) Appl. No.: 14/997,459

(22) Filed: Jan. 15, 2016

(65) Prior Publication Data
US 2016/0133362 A1    May 12, 2016

Related U.S. Application Data

(63) Continuation of application No. PCT/JP2014/004043, filed on Aug. 1, 2014.

(30) Foreign Application Priority Data

Aug. 7, 2013 (JP) .................................. 2013-163884
Sep. 19, 2013 (JP) .................................. 2013-193812
Feb. 13, 2014 (JP) .................................. 2014-025364

(51) Int. Cl.
*H01C 1/14* (2006.01)
*H01C 7/00* (2006.01)
(Continued)

(52) U.S. Cl.
CPC ................. *H01C 1/14* (2013.01); *G03F 7/40* (2013.01); *H01C 7/003* (2013.01); *H01C 17/003* (2013.01);
(Continued)

(58) Field of Classification Search
CPC .. H01C 17/245; H01C 17/006; H01C 17/003; H01C 17/24; H01C 1/142; H01C 1/144; H01C 7/003
See application file for complete search history.

(56) References Cited

U.S. PATENT DOCUMENTS

| | | | | |
|---|---|---|---|---|
| 5,128,827 | A | * | 7/1992 | Yokotani ................ H01C 1/142 29/25.42 |
| 6,916,433 | B2 | * | 7/2005 | Mitani ....................... C09J 9/02 252/500 |

(Continued)

FOREIGN PATENT DOCUMENTS

| | | |
|---|---|---|
| JP | 2002-246206 | 8/2002 |
| JP | 2004-186541 | 7/2004 |

(Continued)

OTHER PUBLICATIONS

International Search Report of PCT application No. PCT/JP2014/004043 dated Oct. 28, 2014.

*Primary Examiner* — Kyung Lee
(74) *Attorney, Agent, or Firm* — Wenderoth, Lind & Ponack, L.L.P.

(57) ABSTRACT

A resistor includes a resistive element, a protective film, and a pair of electrodes. The resistive element is made of a metal plate. The protective film is formed on the upper surface of the resistive element. The plated layers are formed to cover the electrodes. The electrodes are separated from each other with the protective film therebetween and are formed at both ends of the upper surface of the resistive element. The electrodes are formed by printing metal-containing paste.

7 Claims, 16 Drawing Sheets

(51) Int. Cl.
    *H01C 17/065* (2006.01)
    *H01C 17/24* (2006.01)
    *H01C 17/28* (2006.01)
    *G03F 7/40* (2006.01)
    *H01C 17/00* (2006.01)
    *H01C 17/06* (2006.01)

(52) U.S. Cl.
    CPC ........... *H01C 17/06* (2013.01); *H01C 17/065* (2013.01); *H01C 17/24* (2013.01); *H01C 17/28* (2013.01); *H01C 17/281* (2013.01)

(56) References Cited

U.S. PATENT DOCUMENTS

| | | |
|---|---|---|
| 2005/0035844 A1 | 2/2005 | Tsukada |
| 2005/0258930 A1* | 11/2005 | Ishida ................ H01C 1/144 338/309 |
| 2006/0097340 A1 | 5/2006 | Tsukda et al. |
| 2008/0272879 A1* | 11/2008 | Tsukada ............. H01C 1/144 338/307 |
| 2009/0153287 A1* | 6/2009 | Tsukada ............. H01C 1/142 338/327 |
| 2010/0176913 A1* | 7/2010 | Hirano ............... H01C 17/245 338/328 |

FOREIGN PATENT DOCUMENTS

| | | |
|---|---|---|
| JP | 2004-327906 | 11/2004 |
| JP | 2007-049207 | 2/2007 |
| JP | 2007-220859 | 8/2007 |
| JP | 2007-220860 | 8/2007 |
| JP | 2011-096814 | 5/2011 |

* cited by examiner

RESISTOR AND METHOD FOR MANUFACTURING SAME

BACKGROUND

1. Technical Field

The present disclosure relates to a compact low-resistance resistor used mainly to detect the current values of various electronic apparatuses and also relates to a method for manufacturing the resistor.

2. Background Art

As shown in FIG. 18, a conventional resistor of this type includes the following: resistive element 1 made of a metal plate; protective film 2 formed in the center of one surface of resistive element 1; electrodes 3 separated from each other with protective film 2 therebetween and formed by a plating method at both ends of the one surface of resistive element 1; and plated layers 4 covering electrodes 3, respectively. Electrodes 3 and plated layers 4 partially overlap and are in direct contact with the edges of protective film 2. The resistor further includes protective film 2a placed on the other surface of resistive element 1.

Protective film 2 is formed in the center of the one surface of resistive element 1 first, and then electrodes 3 are formed by the plating method using protective film 2 as a plating resist.

An example of a conventional technique related to the present disclosure is shown in Japanese Unexamined Patent Application Publication No. 2007-49207.

SUMMARY

A first resistor according to the present disclosure includes the following: a resistive element made of a metal plate; a protective film formed on a first surface of the resistive element; and a pair of electrodes separated from each other with the protective film therebetween and formed at both ends of the first surface of the resistive element. The electrodes are formed by printing paste containing resin and metal powder contained in the resin.

A first method of manufacturing a resistor according to the present disclosure includes the following steps: forming a plurality of electrodes by printing metal powder-containing paste at space intervals on an upper surface of a resistive element made of metal; forming a protective film so as to cover the upper surface of the resistive element and upper surfaces of the electrodes; and grinding the protective film until the electrodes are exposed.

A second method of manufacturing a resistor according to the present disclosure includes the following steps: forming a plurality of belt-shaped electrodes by printing metal powder-containing paste at space intervals on a surface of a sheet-shaped resistive element made of metal; and forming, on the sheet-shaped resistive element, a slit crossing the belt-shaped electrodes. The second method further includes the following steps: forming a first insulating film between each adjacent two of the belt-shaped electrodes and forming a second insulating film filling the slit; and dividing the sheet-shaped resistive element into individual resistive elements by cutting the sheet-shaped resistive element along the slit and along the belt-shaped electrodes.

A second resistor according to the present disclosure includes the following: a resistive element made of a metal plate; a pair of electrodes formed at both ends of a first surface of the resistive element by printing paste containing resin and metal powder contained in the resin; a first insulating film formed on the first surface of the resistive element; and a second insulating film formed on a second surface perpendicular to the first surface of the resistive element. The second insulating film has a cutting trace on the surface thereof.

A third method of manufacturing a resistor according to the present disclosure includes the following steps: forming a resist on an upper surface of a sheet-shaped resistive element made of metal; and forming a plurality of belt-shaped spaces in the resist. The third method further includes the following steps: forming belt-shaped electrodes on the upper surface of the sheet-shaped resistive element by printing metal paste in the spaces; removing the resist; and forming an insulating film covering parts of the sheet-shaped resistive element which are exposed from the belt-shaped electrodes. The third method further includes the step of cutting the sheet-shaped resistive element including the belt-shaped electrodes and the insulating film into individual resistive elements. When forming the belt-shaped spaces in the resist, an exposure mask having a plurality of belt-shaped openings is placed on the resist, and the resist is exposed through the exposure mask and removed partially in the shape of belts.

These resistors and their manufacturing methods according to the present disclosure can maintain the connection reliability between the resistive element and the electrodes, and can also increase the production of the resistors and improve the accuracy of resistance value.

DETAILED DESCRIPTION OF PREFERRED EMBODIMENTS

Figure 1:
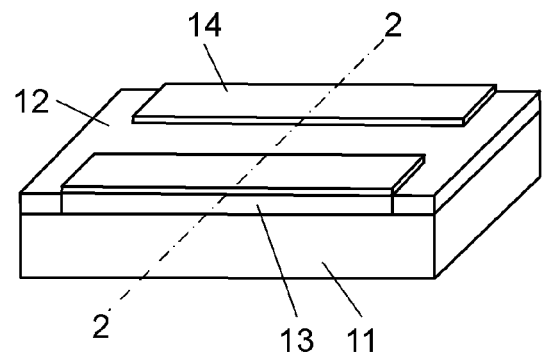
FIG. 1 is a perspective view of a resistor according to a first exemplary embodiment of the present disclosure.

Prior to describing exemplary embodiments of the present disclosure, problems of the conventional resistor described above with reference to FIG. 18 will now be described. In this resistor, electrodes 3 partially overlap and are in direct contact with the edges of protective film 2. As a result, resistive element 1 has an effective length t2, which determines the resistance, larger than the distance t1 between electrodes 3. Therefore, even if the length of resistive element 1 is reduced for miniaturization, the effective length t2 is still somewhat larger than the distance t1 between electrodes 3. This provides an insufficient connection area between resistive element 1 and electrodes 3, possibly causing their connection to be unreliable.

The resistor according to exemplary embodiments of the present disclosure, which solves the above-described problems and ensures high connection reliability between the resistive element and the electrodes will now be described with reference to drawings. In these embodiments, the same components as those in the preceding embodiments are denoted by the same reference numerals, and thus a detailed description thereof may be omitted in the subsequent embodiments.

First Exemplary Embodiment

Figure 2:
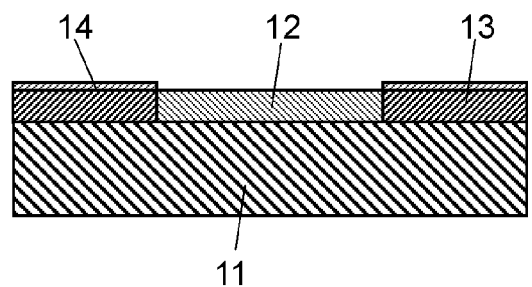
FIG. 2 is a sectional view taken along line 2-2 in FIG. 1.

FIG. 1 is a perspective view of a resistor according to a first exemplary embodiment of the present disclosure, and FIG. 2 is a sectional view taken along line 2-2 in FIG. 1.

As shown in FIGS. 1 and 2, the resistor according to the first exemplary embodiment includes the following: resistive element 11 made of a metal plate, protective film 12 formed in the center of the upper surface of resistive element 11, a pair of electrodes 13 separated from each other with protective film 12 therebetween and formed at both ends of the upper surface of resistive element 11, and plated layers 14 covering electrodes 13.

Electrodes 13 are formed by printing metal paste containing a solvent, resin, and metal powder contained in the resin.

In the above configuration, resistive element 11 is a plate of Cu-containing metal, such as CuNi and CuMn.

Protective film 12 is formed at least in the center of the upper surface (first surface) of resistive element 11 by coating and drying either epoxy resin or silicon resin.

Electrodes 13 are separated from each other with protective film 12 therebetween and formed at both ends in a direction along the shorter side of the upper surface of resistive element 11. Electrodes 13 are exposed on the lateral surfaces of the longer sides of resistive element 11 and are not exposed on the lateral surfaces of the shorter sides of resistive element 11. Electrodes 13 are made by printing Cu-based metal paste not containing a glass frit, drying it, and sintering it at a temperature from 800° C. to 900° C. in a nitrogen atmosphere.

At least the portions of the upper surface of protective film 12 in the vicinity of electrodes 13 are flush with the upper surface of electrodes 13. This makes only plated layers 14 project from the upper surface of protective film 12, thereby providing a thin resistor as a product. Electrodes 13 do not overlap the edges of protective film 12, and protective film 12 covers the entire area of the upper surface of resistive element 11 in which electrodes 13 are not formed.

Note that electrodes 13 may be exposed also to the lateral surfaces of the shorter sides of resistive element 11. Alternatively, electrodes 13 may be formed at both ends in a direction along the longer side instead of the shorter side of the upper surface of resistive element 11. Further alternatively, electrodes 13 may be exposed to the lateral surfaces of neither the long nor short sides of resistive element 11. In FIGS. 1 and 2, electrodes 13 are rectangular prisms, but may alternatively be tapered or step-like so that the distance between electrodes 13 expands upward.

If necessary, plated layers 14 of nickel and tin plating are formed so as to cover the upper surface of electrodes 13.

Figure 3:
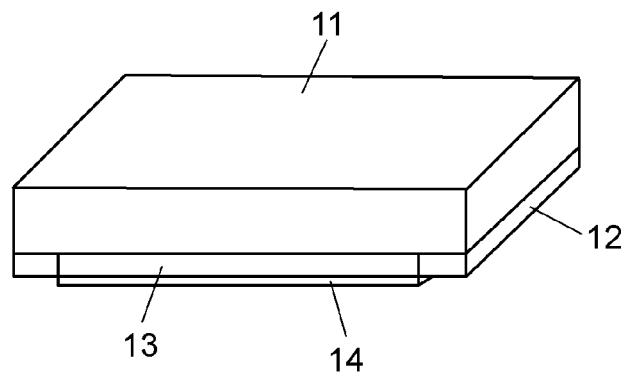
FIG. 3 is a perspective view of the resistor according to the first exemplary embodiment at the time of being mounted.

As shown in FIG. 3, the resistor is mounted on a board such that the side having electrodes 13 and plated layers 14 faces down. In the present exemplary embodiment, however, the side having electrodes 13 and plated layers 14 is referred to as the upper surface of resistive element 11 for convenience of explanation.

A method of manufacturing the resistor according to the first exemplary embodiment of the present disclosure will now be described with reference to drawings.

Figure 4A:
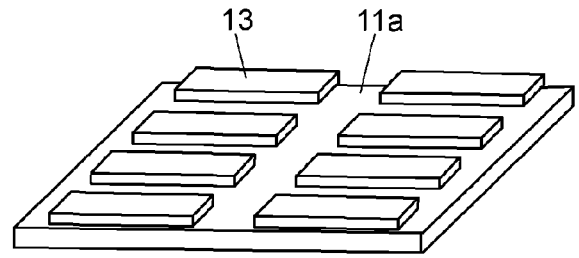
FIG. 4A is a perspective view showing a method of manufacturing the resistor according to the first exemplary embodiment.

First, as shown in FIG. 4A, a plurality of electrodes 13 are formed on sheet-shaped resistive element 11a, which is a plate or foil of Cu-containing alloy such as CuNi and CuMn or Cu metal.

Electrodes 13 are formed at regular space intervals in both the longitudinal and transverse directions as follows, using a printing mask. Cu powder-based metal paste not containing a glass frit is printed on the surface of sheet-shaped resistive element 11a, dried, and sintered at a temperature 800° C. to 900° C. in a nitrogen atmosphere. The printing process can be repeated until electrodes 13 have a predetermined thickness.

Sheet-shaped resistive element 11a is made of metal of Cu-containing alloy, such as CuNi and CuMn. Electrodes 13 are made of the same metal as the one used in sheet-shaped resistive element 11a, which is Cu. This allows the Cu contained in the paste and the Cu contained in the alloy to diffuse and bond with each other at the interface between electrodes 13 and sheet-shaped resistive element 11a, thereby strengthening the bond between them. This holds true for the second and third exemplary embodiments described later.

Figure 4B:
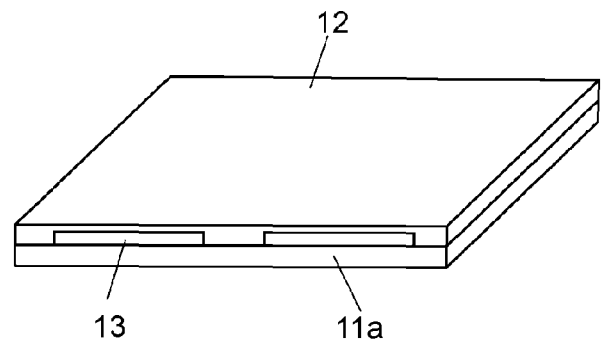
FIG. 4B is a perspective view showing the method of manufacturing the resistor according to the first exemplary embodiment.

Next, as shown in FIG. 4B, protective film 12 is seamlessly formed on the entire upper surfaces of electrodes 13 and the entire upper surface of sheet-shaped resistive element 11a where electrodes 13 are not formed. Protective film 12 is made by coating, drying, and curing either epoxy resin or silicon resin. In FIG. 4B, protective film 12 formed directly on the upper surface of sheet-shaped resistive element 11a is made thicker than electrodes 13, but may alternatively be made thinner than electrodes 13. In the latter case, protective film 12 is seamlessly formed on the entire upper surfaces of electrodes 13 and sheet-shaped resistive element 11a so that electrodes 13 can be entirely covered with protective film 12.

Figure 4C:
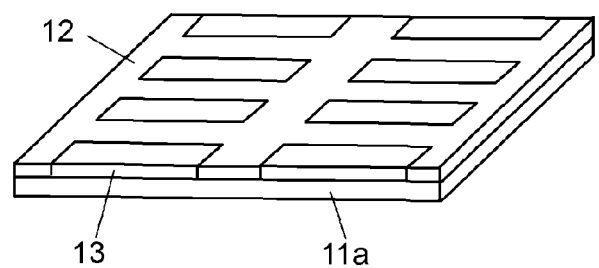
FIG. 4C is a perspective view showing the method of manufacturing the resistor according to the first exemplary embodiment.

Next, as shown in FIG. 4C, protective film 12 is ground by back grinding, polishing, or filing until electrodes 13 are exposed. At this time, electrodes 13 are made substantially as thick as the grounded protective film 12 on the upper surface of sheet-shaped resistive element 11a. In other words, the upper surfaces of electrodes 13 are made flush with the upper surface at the portions of protective film 12 in the vicinity of electrodes 13. Meanwhile, the surfaces of electrodes 13 may also be partially grounded.

The above-described method ensures the formation of protective film 12 between adjacent electrodes 13, preventing the creation of gaps between electrodes 13 and protective film 12 or the adhesion of the solder to electrodes 13 due to insufficient application of protective film 12. As a result, the resistance can be stabilized.

Figure 4D:
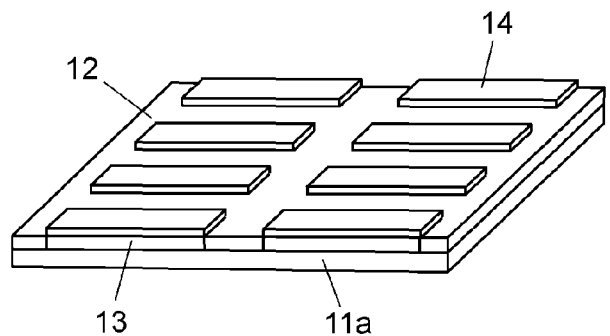
FIG. 4D is a perspective view showing the method of manufacturing the resistor according to the first exemplary embodiment.

Next, as shown in FIG. 4D, nickel and tin are plated in that order on the upper surfaces of electrodes 13 so as to form plated layers 14. As described above, when the upper surfaces of electrodes 13 are made flush with the upper surface of protective film 12, only plated layers 14 project from the upper surface of protective film 12. Instead of forming plated layers 14, flux or a material to prevent oxidation of electrodes 13 may be coated.

Figure 5A:
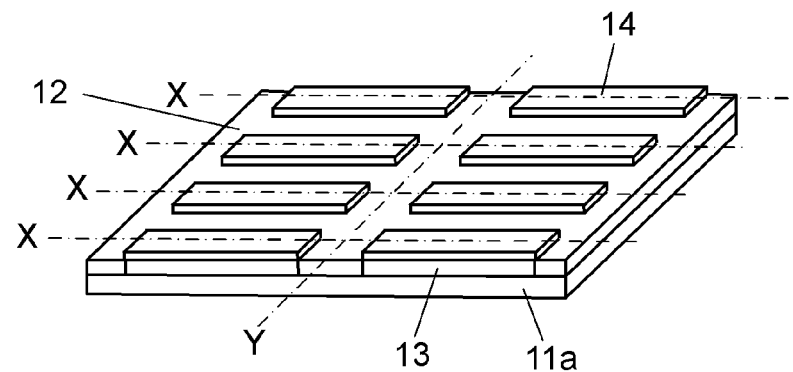
FIG. 5A is a perspective view showing the method of manufacturing the resistor according to the first exemplary embodiment.
Figure 5B:
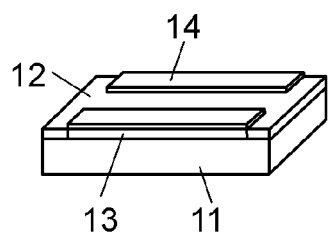
FIG. 5B is a perspective view showing the method of manufacturing the resistor according to the first exemplary embodiment.

Next, as shown in FIG. 5A, sheet-shaped resistive element 11a is cut horizontally (along lines X) in such a manner that each electrode 13 placed sideways is cut in half lengthwise. Sheet-shaped resistive element 11a is also cut vertically (along line Y) in such a manner that protective film 12 is cut along the center line, which is the midpoint between horizontally adjacent electrodes 13. As a result, sheet-shaped resistive element 11a is divided into individual resistive elements as shown in FIG. 5B. The cutting is done with a laser, a dicing saw, or a press. In addition, burring is done if necessary.

Figure 5C:
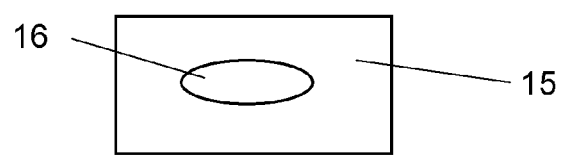
FIG. 5C is a back side view showing the method of manufacturing the resistor according to the first exemplary embodiment.

Next, as shown in FIG. 5C, if needed, recess 16 is formed on the rear surface of each individual resistive element 15, and trimmed by sandblasting, cutting, or other methods. The trimming can be performed so as to reduce the width or length of resistive element 11, grind the entire upper surface of resistive element 11, or cut out a part of resistive element 11 between adjacent electrodes 13.

Figure 5D:
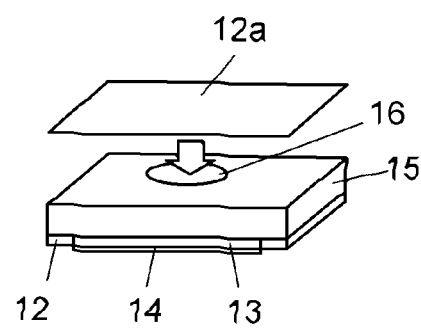
FIG. 5D is a perspective view showing the method of manufacturing the resistor according to the first exemplary embodiment.
Figure 5E:
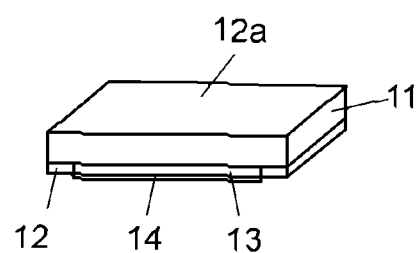
FIG. 5E is a perspective view showing the method of manufacturing the resistor according to the first exemplary embodiment.

Finally, as shown in FIG. 5D, if needed, rear-surface insulating film 12a is formed on the rear surface of each individual resistive element 15, thereby obtaining an individual resistor shown in FIG. 5E. Each individual resistive element 15 is identical to resistive element 11 used in a finished product (shown in FIG. 1). Alternatively, rear-surface insulating film 12a may be formed together with protective film 12.

FIG. 5C is a back side view, and FIGS. 5D and 5E are perspective views of resistive element 11 seen from the bottom surface (rear surface). FIGS. 4A to 5B are perspective views of resistive element 11 seen from the upper surface. FIGS. 4A to 5A show a total of eight electrodes 13 arranged two horizontally and four vertically, but the number is not limited.

In the resistor according to the first exemplary embodiment of the present disclosure, electrodes 13 are formed by printing and sintering metal (Cu)-containing paste. This allows the Cu contained in the paste composing electrodes 13 and the Cu composing resistive element 11 to diffuse and bond with each other at the interface between electrodes 13 and resistive element 11, thereby strengthening the bond between them. As a result, even if the connection area between resistive element 11 and electrodes 13 is reduced for miniaturization, their connection reliability can be maintained.

Even if electrodes 13 partially overlap and are in direct contact with the edges of protective film 12, thereby reducing the connection area between electrodes 13 and resistive element 11, the adhesion between electrodes 13 and resistive element 11 remains strong enough to maintain their connection reliability.

It is preferable that the alloy composing resistive element 11 contain the same metal as the one composing electrodes 13 because it facilitates the diffusion of the metal.

Figure 18:
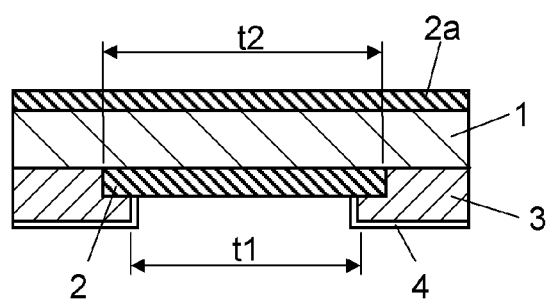
FIG. 18 is a sectional view of a conventional resistor.

In the conventional resistor shown in FIG. 18, electrodes 3 are formed by a plating method. This causes electrodes 3 to partially overlap and be in direct contact with the edges of protective film 2, thereby causing the effective length t2 of the resistive element, which determines the resistance, to be larger than the distance t1 between electrodes 3. Therefore, if the length of the resistive element is reduced for miniaturization, the resistance cannot be reduced because of the large effective length t2 of the resistive element. In contrast, in the present exemplary embodiment, even if the resistor is miniaturized, the resistance can be low for the following reason. Electrodes 13 are formed by a printing method to make their upper surfaces flush with the upper surface of protective film 12, thereby making the distance between adjacent electrodes 13 the same as the effective length of the resistive element which determines the resistance.

Electrodes 13 could alternatively be formed by a cladding method, but in the case of manufacturing compact resistors, it would be difficult to keep high dimensional accuracy in cutting and other processes, and hence, to obtain a high yield. In the present exemplary embodiment, however, electrodes 13 are formed by a printing method. This eliminates the need for the cutting and other processes, thereby achieving a high dimensional accuracy.

Protective film 12 may coat the lateral surfaces of electrodes 13. This effectively prevents the adhesion of the solder to electrodes 13, thereby further stabilizing the resistance.

In the method according to the present exemplary embodiment, electrodes 13 are formed by printing and sintering methods. Therefore, the resistors can be manufactured less expensively than in a case where plating and cladding methods are used.

In the first exemplary embodiment of the present disclosure, electrodes 13 are sintered at a temperature from 800° C. to 900° C., but can be sintered at a lower temperature if electrodes 13 are made of nanoparticles.

Second Exemplary Embodiment

A method of manufacturing a resistor according to a second exemplary embodiment of the present disclosure will now be described with reference to drawings.

Figure 6A:
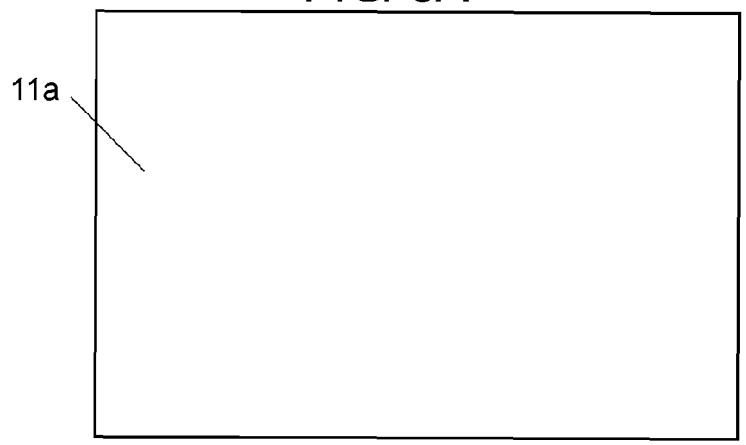
FIG. 6A is a top view showing a method of manufacturing a resistor according to a second exemplary embodiment of the present disclosure.

First, as shown in FIG. 6A, sheet-shaped resistive element 11a is prepared as a plate or foil of metal such as CuNi, NiCr, and CuMn.

Figure 6B:
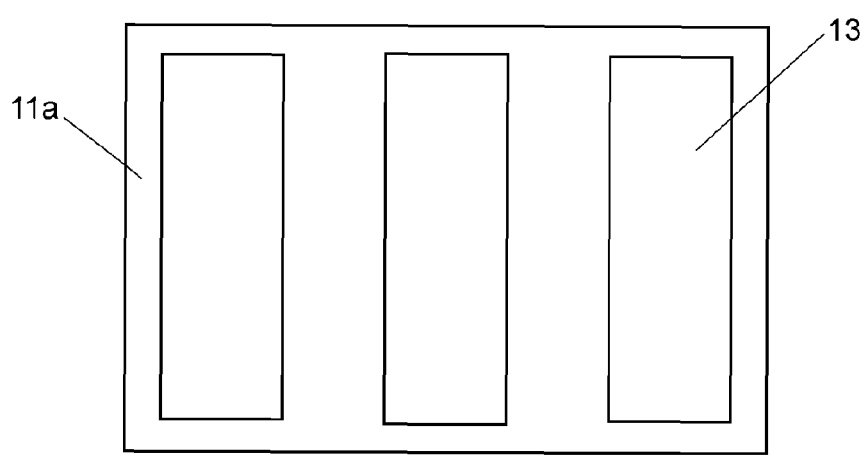
FIG. 6B is a top view showing the method of manufacturing the resistor according to the second exemplary embodiment.

Next, as shown in FIG. 6B, Cu-based metal paste not containing a glass frit is printed, in the form of regularly spaced belts, on the upper surface (first surface) of sheet-shaped resistive element 11a and is then dried. The dried metal paste is sintered at a temperature from 800° C. to 900° C. in a nitrogen atmosphere so as to form a plurality of belt-shaped electrodes 13. The paste may alternatively be Ag-based.

In the same manner as in the first exemplary embodiment, it is preferable to use the same metal both for belt-shaped electrodes 13 and for sheet-shaped resistive element 11a.

Figure 6C:
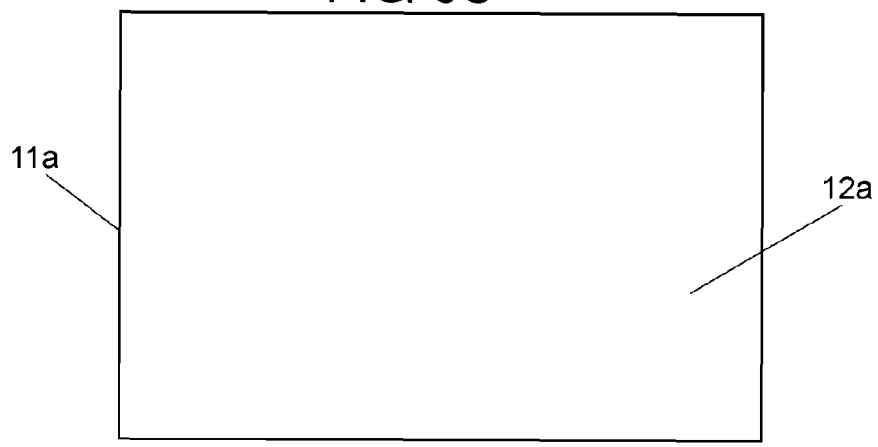
FIG. 6C is a back side view showing the method of manufacturing the resistor according to the second exemplary embodiment.

Next, as shown in FIG. 6C, rear-surface insulating film (protective film) 12a of epoxy resin is formed entirely on the rear surface of sheet-shaped resistive element 11a, that is, on the surface opposite to the surface on which belt-shaped electrodes 13 are formed.

FIG. 6C is a back side view, and FIGS. 6A, 6B and FIGS. 7A to 8B are top views. In actually mounting the resistor, the side having belt-shaped electrodes 13 faces down (the rear surface side). However, for convenience of explanation, in FIGS. 6A, 6B, and FIGS. 7A to 8B, the side having belt-shaped electrodes 13 faces up.

Figure 7A:
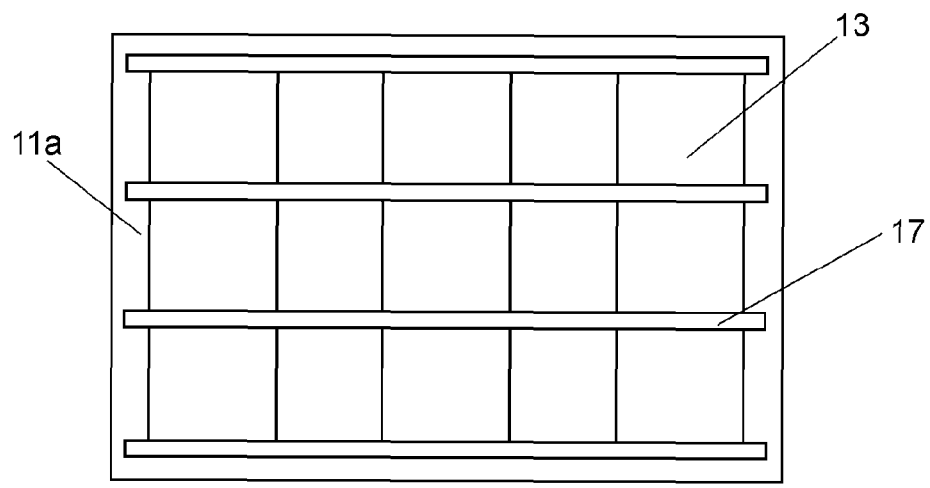
FIG. 7A is a top view showing the method of manufacturing the resistor according to the second exemplary embodiment.

Next, as shown in FIG. 7A, sheet-shaped resistive element 11a mounted with belt-shaped electrodes 13 is diced in the direction perpendicular to belt-shaped electrodes 13, thereby forming a plurality of slits 17. Slits 17 are formed at regular space intervals in such a manner as to penetrate sheet-shaped resistive element 11a and rear-surface insulating film 12a. Alternatively, slits 17 may be formed before rear-surface insulating film 12a is formed.

Figure 7B:
FIG. 7B is a top view showing the method of manufacturing the resistor according to the second exemplary embodiment.

Next, as shown in FIG. 7B, first insulating film 18 is formed between adjacent belt-shaped electrodes 13, and then second insulating film 19 is formed to fill slits 17. First insulating film 18 and second insulating film 19 are turned into protective film 12 made of epoxy resin.

After forming second insulating film 19, first insulating film 18 is formed using a mask. Alternatively, first insulating film 18 may be formed first, or both films 18 and 19 may be formed at the same time.

A part of first insulating film 18 is so made to cover the ends of belt-shaped electrodes 13, whereas second insulating film 19 is so made to completely fill slits 17.

Before first and second insulating films 18 and 19 are formed, trimming (modifying the resistance) is performed if necessary. The trimming is performed by forming trimming grooves (not shown) linearly from slits 17 toward the center of resistive element 11 while measuring the resistance between adjacent electrodes 13 so that each individual resistive element can have a predetermined resistance. At this moment, the current during the measurement of the resistance is prevented from flowing in parallel at other portions by cutting one edge of sheet-shaped resistive element 11a so that slits 17 can be exposed to the edge.

After slits 17 are formed, rear-surface insulating film 12a made of epoxy resin can be formed on the rear surface of sheet-shaped resistive element 11a so as to fill slits 17 with the epoxy resin at the same time as the formation of rear-surface insulating film 12a. This eliminates the need to provide second insulating film 19 separately, and is advantageous in terms of cost and productivity.

Figure 7C:
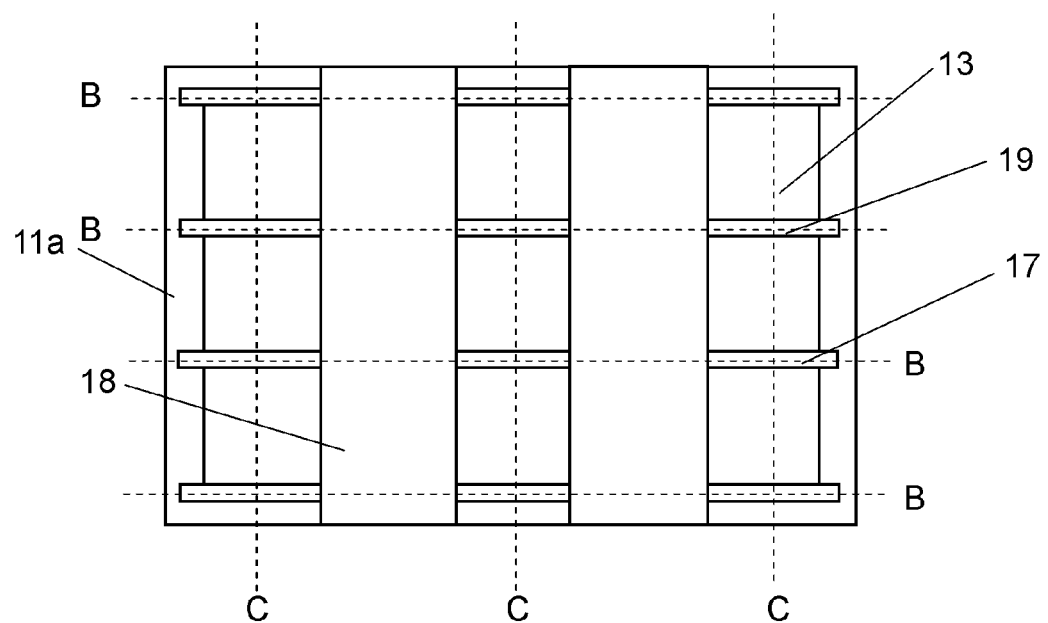
FIG. 7C is a top view showing the method of manufacturing the resistor according to the second exemplary embodiment.
Figure 8A:
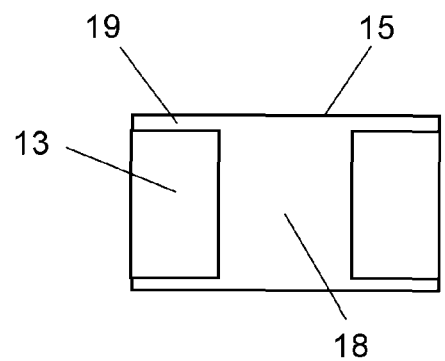
FIG. 8A is a top view showing the method of manufacturing the resistor according to the second exemplary embodiment.

Next, as shown in FIG. 7C, sheet-shaped resistive element 11a is cut horizontally (along lines B) with a dicing saw, a laser, or a cutting blade, so that each slit 17 filled with second insulating film 19 is cut in half lengthwise. Sheet-shaped resistive element 11a is further cut in the direction (along lines C) perpendicular to slits 17 with a dicing saw, a laser, or a cutting blade, so that belt-shaped electrodes 13 are cut in half lengthwise. As a result, individual resistive elements 15 as shown in FIG. 8A are obtained. Electrodes 13 are located along the short sides of each resistive element 15.

In this case, sheet-shaped resistive element 11a is cut along lines B which coincide with the center lines of slits 17 when seen from above, and second insulating film 19 remains on both sides of each of the cutting lines.

Figure 8B:
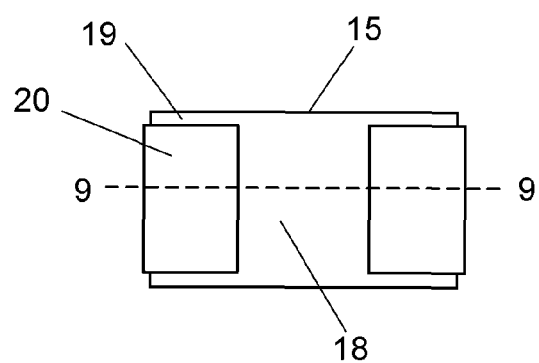
FIG. 8B is a top view showing the method of manufacturing the resistor according to the second exemplary embodiment.

Finally, as shown in FIG. 8B, external electrodes 20 are formed at both ends of each individual resistive element 15 by forming end-face electrodes and plating them with copper, nickel, and tin in this order.

Figure 9:
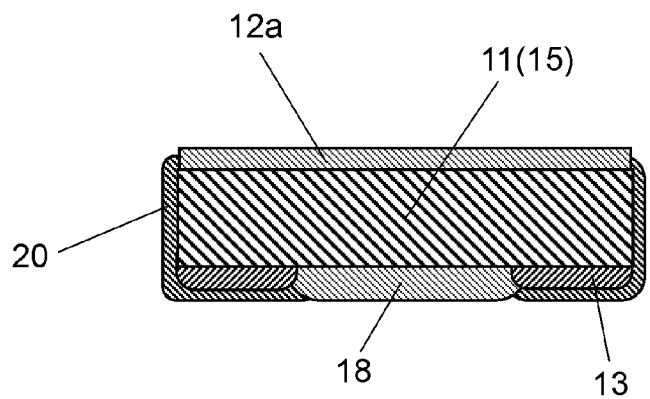
FIG. 9 is a sectional view taken along line 9-9 in FIG. 8B.
Figure 10:
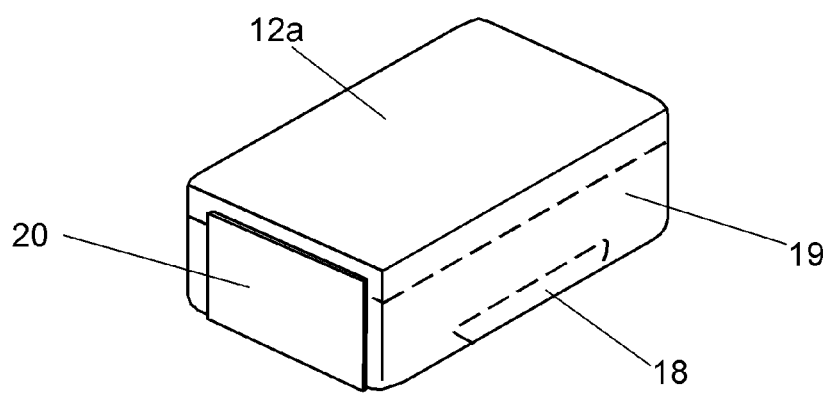
FIG. 10 is a perspective view of the resistor according to the second exemplary embodiment.

A sectional view of the above-obtained resistor taken along line 9-9 in FIG. 8B is shown in FIG. 9, and the perspective view of the resistor is shown in FIG. 10. In FIGS. 9 and 10, the upper surface (the component side to be mounted) of sheet-shaped resistive element 11a shown in FIGS. 6A to 7C faces down. Although FIGS. 6A to 7C show three belt-shaped electrodes 13, the number can be other than three.

In FIGS. 9 and 10, sheet-shaped resistive element 11a shown in FIGS. 6A to 7C are divided into individual resistive elements 15, each of which is identical to resistive element 11 used in a finished product. Two half-divided belt-shaped electrodes 13 are formed as a pair of electrodes 13 at both ends of the upper surface of resistive element 11. The resistor obtained as described above includes the following: external electrodes 20 formed at both ends of resistive element 11 and connected to resistive element 11 and electrodes 13; rear-surface insulating film 12a formed on the rear surface of resistive element 11; first insulating film 18 formed on the upper surface of resistive element 11; and second insulating film 19 formed on the lateral surfaces of resistive element 11 and of electrodes 13 (on the second surface perpendicular to the first surface).

The surface of second insulating film 19 has a cutting trace generated during the cutting with the above-mentioned dicing saw, laser, or cutting blade. The cutting trace appears as molten resin in the case of using a laser, and a streak in the case of using a dicing saw.

Cutting sheet-shaped resistive element 11a along second insulating film 19 can define the cutting lines, thereby fixing the distance between the inner surface of slits 17 and the cutting lines. This improves the accuracy of the distance between the inner surface of slits 17 and the cutting lines, that is, the accuracy of the thickness of second insulating film 19. As a result, the products with the cutting trace on the surface of second insulating film 19 can have high dimensional accuracy. In contrast, if second insulating film 19 were coated to the lateral surfaces of each individual resistive element 15, second insulating film 19 would vary in thickness according to conditions such as temperature and shape distortion due to surface tension.

In the method of manufacturing the resistor according to the second exemplary embodiment of the present disclosure, slits 17 are formed in sheet-shaped resistive element 11a, whereas second insulating film 19 is formed to fill slits 17. After that, sheet-shaped resistive element 11a is divided into individual resistive elements 15 by cutting it along the center of each slit 17. Hence, second insulating film 19 can be formed before sheet-shaped resistive element 11a is divided into individual resistive elements 15. This makes it unnecessary to form second insulating film 19 for each individual resistive element 15, thereby increasing the production of the resistor.

More specifically, forming second insulating film 19 filled into slits 17 of sheet-shaped resistive element 11a results in providing second insulating film 19 to all individual resistive elements 15 at the same time. Then, two half-cuts of second insulating film 19, which is cut in half along each line B shown in FIG. 7C, can be located on the lateral sides of electrodes 13 and of each individual resistive element 15.

Figure 11:
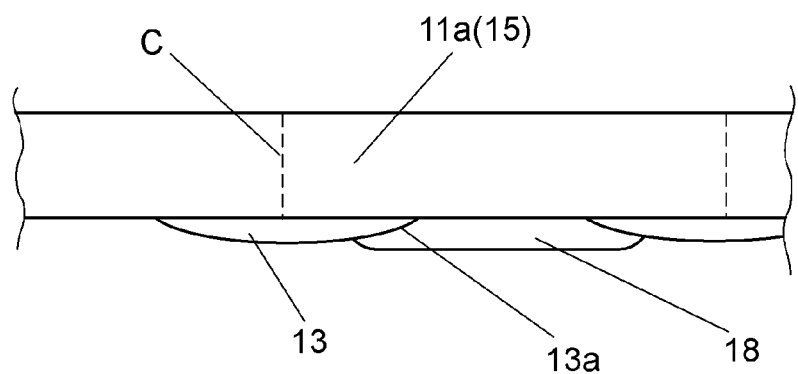
FIG. 11 is a side view of an essential part of the resistor according to the second exemplary embodiment.

Forming belt-shaped electrodes 13 by printing and sintering metal-containing paste allows the paste to have a thin periphery due to surface tension during the sintering. As a result, as shown FIG. 11, lateral portions 13a of belt-shaped electrodes 13 opposing each other on each individual resistive element 15 are thinner than the remaining portions of electrodes 13. As a result, the portion between adjacent belt-shaped electrodes 13 in which first insulating film 18 is formed becomes wider upward. This facilitates the pouring of first insulating film 18 into a place between adjacent belt-shaped electrodes 13, allowing first insulating film 18 to be formed between belt-shaped electrodes 13 without gaps. If, on the other hand, belt-shaped electrodes 13 were formed by cladding, welding, or plating, belt-shaped electrodes 13 would have substantially uniform thickness. In this case, the distance between adjacent belt-shaped electrodes 13 in which first insulating film 18 is formed would not become wider upward. This would create gaps between first insulating film 18 and belt-shaped electrodes 13, and the air in the gaps might expand due to the heat developed in use and cause first insulating film 18 to come off.

Third Exemplary Embodiment

A method of manufacturing a resistor according to a third exemplary embodiment of the present disclosure will now be described with reference to drawings.

Figure 12A:
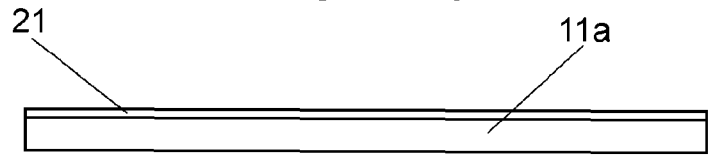
FIG. 12A is a side view showing a method of manufacturing a resistor according to a third exemplary embodiment of the present disclosure.

First, as shown in FIG. 12A, resist 21 as a photoresist is bonded to the entire upper surface of sheet-shaped resistive element 11a which is a plate or foil of metal of Cu-containing alloy, such as CuNi and CuMn.

Figure 12B:
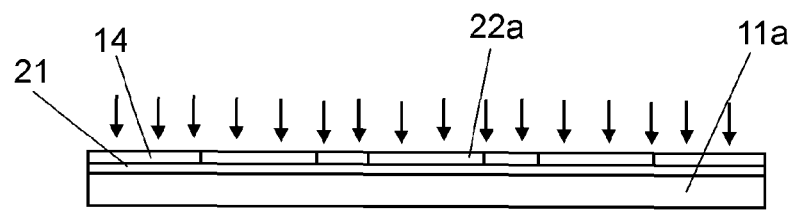
FIG. 12B is a side view showing the method of manufacturing the resistor according to the third exemplary embodiment.

Next, as shown in FIG. 12B, an exposure mask having a plurality of belt-shaped openings 22a is placed on resist 21, and ultraviolet light and the like are applied to resist 21 from above. Note that the term "belt-shape" used here refers to the shape viewed from above, not from the lateral side.

Figure 12C:
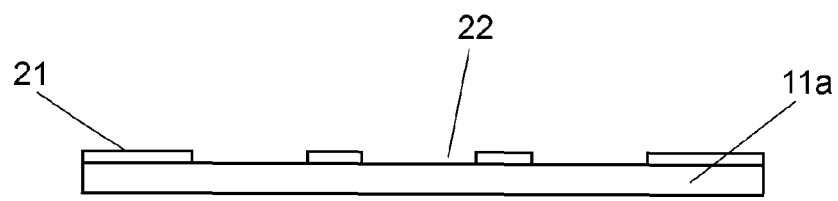
FIG. 12C is a side view showing the method of manufacturing the resistor according to the third exemplary embodiment.

As a result, as shown in FIG. 12C, the portions of resist 21 which are exposed to the ultraviolet light through openings 22a are removed and belt-shaped spaces 22 are provided, whereas the portions of resist 21 which are not exposed to the ultraviolet light remain unremoved and spaces 22 are not formed. In other words, the portions of resist 21 which are located under belt-shaped openings 22a are removed, whereas the other portions of resist 21 remain unremoved. Spaces 22 have substantially the same shape as openings 22a, and the size and position of each of spaces 22 are determined according to the desired the resistance values and sizes of the resistors.

Figure 12D:
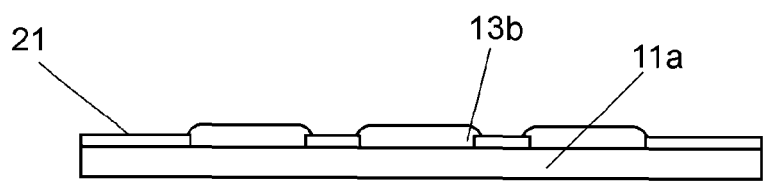
FIG. 12D is a side view showing the method of manufacturing the resistor according to the third exemplary embodiment.

Next, as shown in FIG. 12D, on the upper surface of sheet-shaped resistive element 11a, Cu-based paste 13b not containing a glass frit is printed in belt-shaped spaces 22 from which resist 21 has been removed, and paste 13b is dried.

Figure 12E:
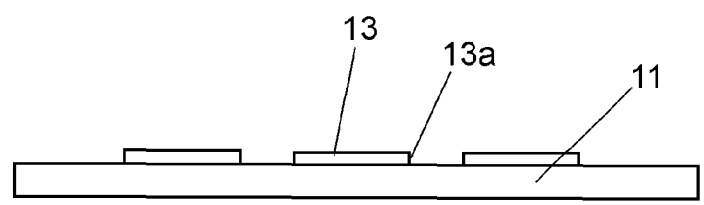
FIG. 12E is a side view showing the method of manufacturing the resistor according to the third exemplary embodiment.

Next, as shown in FIG. 12E, the unremoved portions of resist 21 are removed, and then paste 13b is sintered at a temperature from 800° C. to 900° C. in a nitrogen atmosphere so as to form belt-shaped electrodes 13. When seen from the lateral side, both lateral portions 13a of electrodes 13 are substantially perpendicular to sheet-shaped resistive element 11a.

Even if parts of electrodes 13 cover the unremoved portions of resist 21, these parts can be removed together with the unremoved portions of resist 21.

In the same manner as in the first and second exemplary embodiments, it is preferable to use the same metal both for electrodes 13 and for sheet-shaped resistive element 11a.

It is possible to form rear surface electrodes on the bottom surface of sheet-shaped resistive element 11a in the same manner as electrodes 13.

Figure 13A:
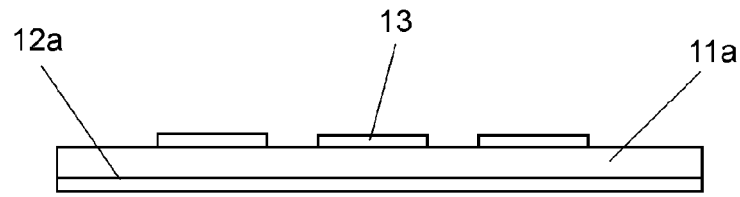
FIG. 13A is a side view showing the method of manufacturing the resistor according to the third exemplary embodiment.

Next, as shown in FIG. 13A, rear-surface insulating film (protective film) 12a made of epoxy resin is formed entirely on the bottom surface of sheet-shaped resistive element 11a, that is, on the surface opposite to the surface on which belt-shaped electrodes 13 are formed (not shown in FIGS. 12A to 12E and FIGS. 13B to 14C).

Figure 13B:
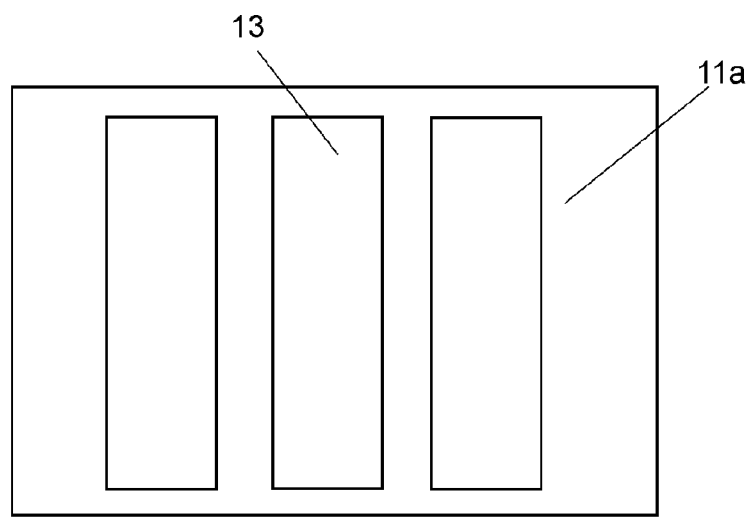
FIG. 13B is a top view showing the method of manufacturing the resistor according to the third exemplary embodiment.

As a result of the above-described method, as shown in FIG. 13B, sheet-shaped resistive element 11a is provided with belt-shaped electrodes 13 arranged at predetermined intervals on the upper surface thereof. FIGS. 12A to 12E and FIG. 13A show side views, and FIGS. 13B to 14C show top views. FIGS. 12D to 14B show three belt-shaped electrodes 13, but the number can be other than three.

Figure 13C:
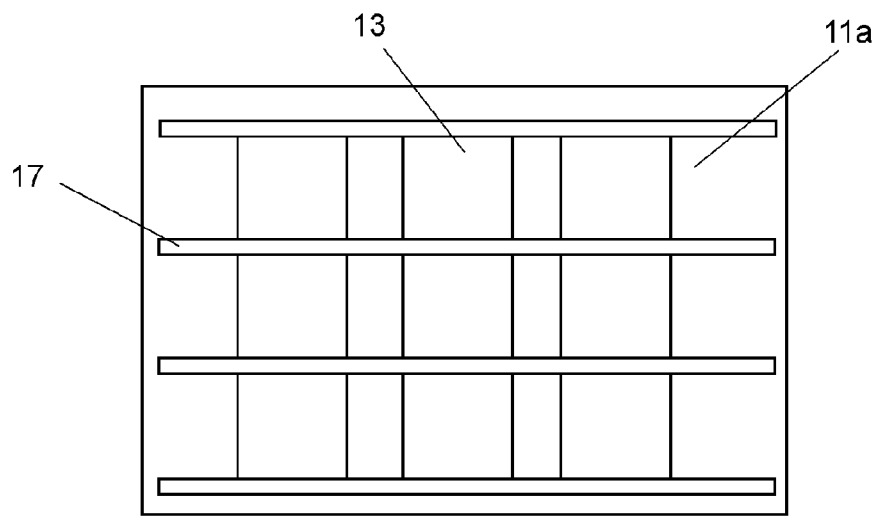
FIG. 13C is a top view showing the method of manufacturing the resistor according to the third exemplary embodiment.

Next, as shown in FIG. 13C, sheet-shaped resistive element 11a provided with belt-shaped electrodes 13 thereon are diced in a direction perpendicular to belt-shaped electrodes 13 so as to form slits 17. Slits 17 are formed at regular space intervals and penetrate sheet-shaped resistive element 11a and rear-surface insulating film 12a. Slits 17 do not reach at least one edge of sheet-shaped resistive element 11a so as to prevent resistive element 11a from being divided apart. Rear-surface insulating film 12a may be formed after slits 17 are formed.

Figure 14A:
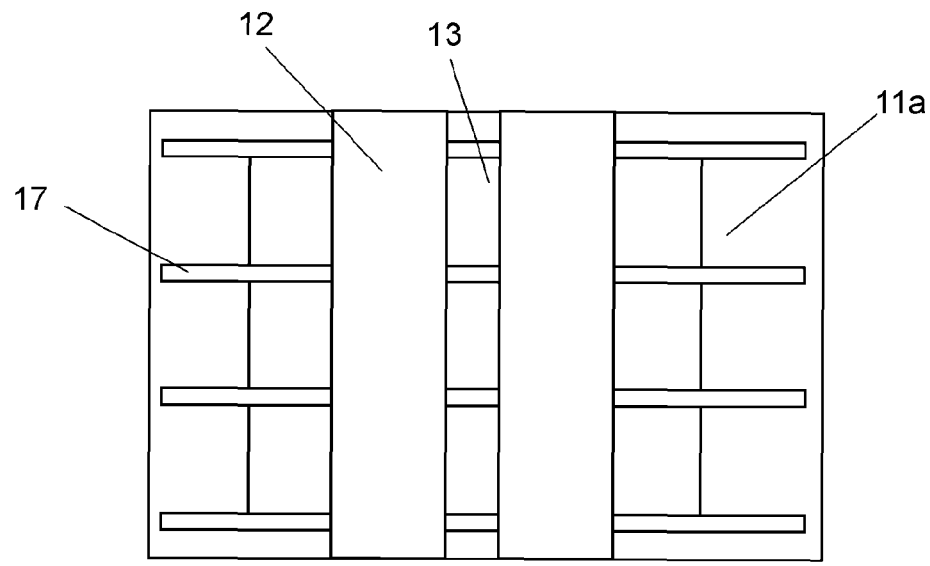
FIG. 14A is a top view showing the method of manufacturing the resistor according to the third exemplary embodiment.

Next, as shown in FIG. 14A, each of insulating films (protective films) 12 of epoxy resin is formed in a belt shape between adjacent belt-shaped electrodes 13. Insulating film 12 is also formed inside slits 17 at this time, such that part of insulating film 12 covers the lateral surfaces of belt-shaped electrodes 13.

Before insulating films 12 are formed, trimming (modifying the resistance value) is performed if necessary. The trimming is performed by forming trimming grooves (not shown) linearly from slits 17 toward the center of resistive element 11 while measuring the resistance value between adjacent electrodes 13 so that each individual resistive element can have a predetermined resistance value.

Figure 14B:
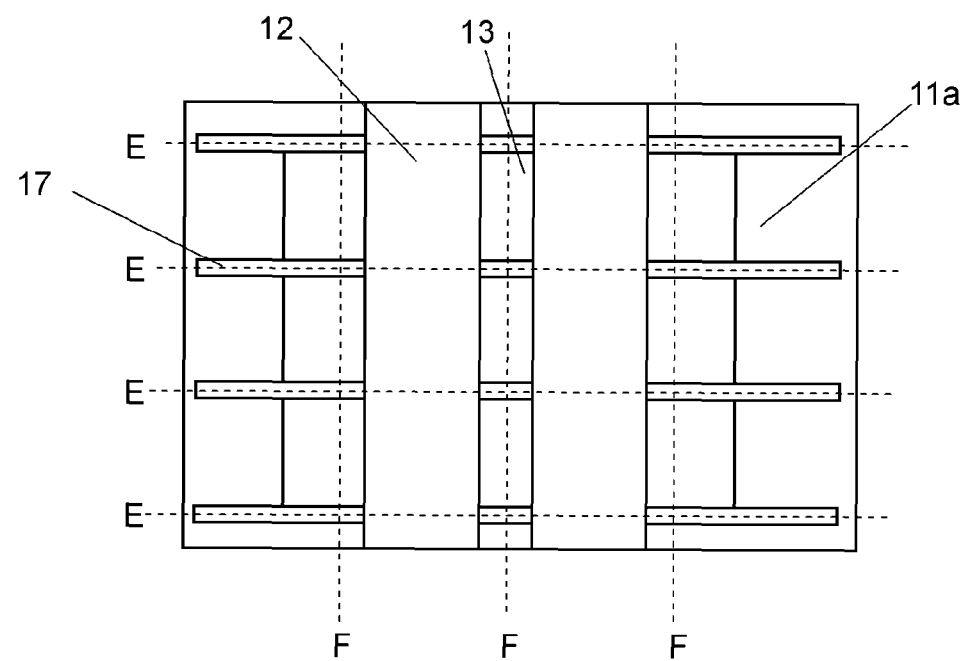
FIG. 14B is a top view showing the method of manufacturing the resistor according to the third exemplary embodiment.
Figure 14C:
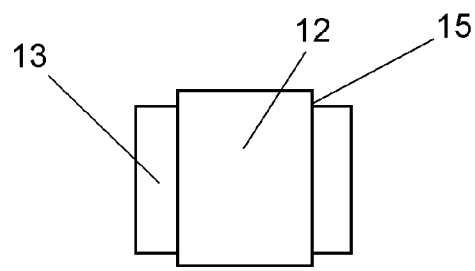
FIG. 14C is a top view showing the method of manufacturing the resistor according to the third exemplary embodiment.

Next, as shown in FIG. 14B, sheet-shaped resistive element 11a is cut along the centers (lines E) of slits 17 with a dicing saw, a laser, or a cutting blade, and is also cut in a direction perpendicular to slits 17, that is, along the centers (lines F) of belt-shaped electrodes 13 with a dicing saw, a laser, or a cutting blade. As a result, individual resistive elements 15 are obtained as shown in FIG. 14C.

Figure 15:
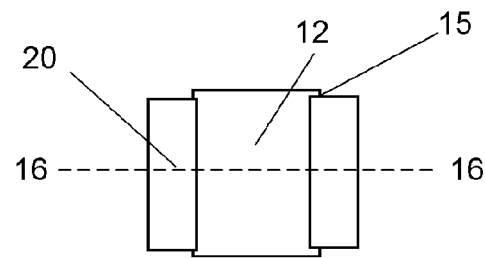
FIG. 15 is a top view showing the method of manufacturing the resistor according to the third exemplary embodiment.

Finally, as shown in FIG. 15, external electrodes 20 are formed at both ends of each individual resistive element 15 by forming end-face electrodes and plating them with copper, nickel, and tin in that order.

Figure 16:
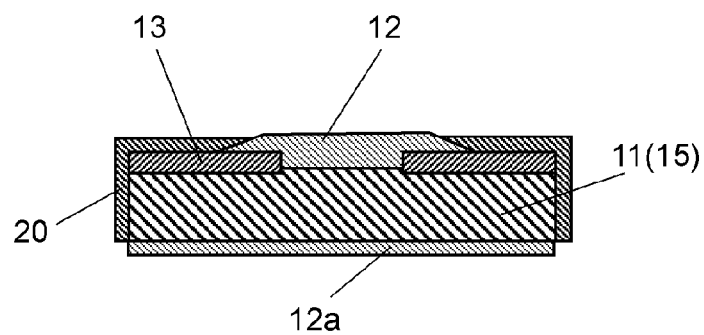
FIG. 16 is a sectional view taken along line 16-16 in FIG. 15.
Figure 17:
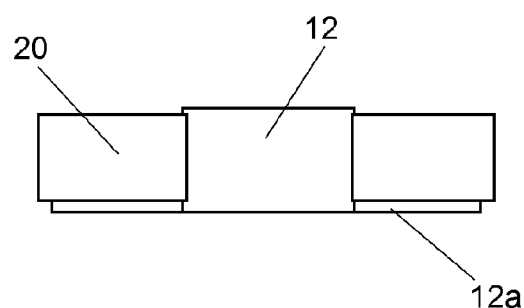
FIG. 17 is a side view of the resistor according to the third exemplary embodiment.

A sectional view of the above-obtained resistor taken along line 16-16 of FIG. 15 is shown in FIG. 16, and the side view of the resistor is shown in FIG. 17. In FIGS. 16 and 17, the surface of sheet-shaped resistive element 11a which does not have electrodes 13 thereon is used as the component side to be mounted; however, as in conventional cases, the surface having electrodes 13 may be used as the component side.

In FIGS. 16 and 17, sheet-shaped resistive element 11a is divided into individual resistive elements 15, each of which is identical to resistive element 11 used in a finished product. The finished resistor includes the following: a pair of electrodes 13 arranged at both ends of the upper surface of resistive element 11, each of the pair being formed by dividing one belt-shaped electrode 13 into half; external electrodes 20 formed at both ends of resistive element 11 and connected to resistive element 11 and electrodes 13, respectively; rear-surface insulating film 12a formed on the rear surface of resistive element 11; and insulating film 12 formed on the upper surface and the lateral surface of resistive element 11. Electrodes 13 are formed along the longer sides of resistive element 11 in the first and third exemplary embodiments, but may alternatively be formed along the shorter sides of resistive element 11 in the same manner as in the second exemplary embodiment. Electrodes 13 may have an L-shaped profile viewed from the lateral surface.

In the method of manufacturing the resistor according to the third exemplary embodiment of the present disclosure, an exposure mask having a plurality of belt-shaped openings 22a is placed on resist 21, and resist 21 is exposed through the exposure mask so as to remove the portions of resist 21 which are located under belt-shaped openings 22a. The other portions of resist 21 over which belt-shaped openings 22a are not formed are left. As a result, belt-shaped spaces 22 are created for forming electrodes 13 on resist 21. This allows lateral portions 13a of electrodes 13 to have high linearity, thereby preventing variations in the distances between adjacent electrodes 13, and hence, providing high accuracy of resistance value.

This also stabilizes the forming position and shape of electrodes 13, so that even if resistive element 11 is short for miniaturization, the distances between adjacent electrodes 13 can be prevented from reduction. Consequently, short circuits can be prevented between adjacent electrodes 13 or between external electrodes 20 in a resistor.

If electrodes 13 were formed by a plating method or a printing method not using an exposure mask, the forming position and shape of each of electrodes 13 would vary depending on the conditions. In the present exemplary embodiment, on the other hand, the forming position and shape of each of electrodes 13 are defined by opening 22a of the exposure mask. This stabilizes the forming position and shape of each of electrodes 13, thereby preventing a reduction in the distances between adjacent electrodes 13. Furthermore, the distances between adjacent electrodes 13 can be easily adjusted to improve the accuracy of resistance value.

Insulating film 12 is formed after electrodes 13 are formed, thereby preventing part of electrodes 13 from overlapping insulating film 12.

Since insulating film 12 is also formed inside slits 17, insulating film 12 is formed on the upper surface and lateral surfaces of resistive element 11, whereas rear-surface insulating film 12a is formed on the rear surface of resistive element 11. Thus, the entire periphery of resistive element 11 is covered with insulating film 12 and rear-surface insulating film 12a. This prevents insulating film 12 and rear-surface insulating film 12a from coming off.

In order to improve the adhesion between electrodes 13 and sheet-shaped resistive element 11a, the surface of resistive element 11a may be previously roughened by sandblasting, plating, chemical treatment, or the like. The area to form electrodes 13 on sheet-shaped resistive element 11a can be roughened by roughening the area of spaces 22 formed by partially removing resist 21 under exposure to ultraviolet light. However, the areas of the surface of resistive element 11a in which electrodes 13 are not formed and which are located under the unremoved portions of resist 21 are not roughened, so that the unremoved portions of resist 21 can easily come off. In this case, resistive element 11 has a higher surface roughness in the portions in which electrodes 13 are formed than in the portions in which electrodes 13 are not formed.

Further, in the first to third exemplary embodiments of the present disclosure, it is advantageous in terms of cost and productivity to form electrodes 13 by a printing method because this method is commonly used in general chip resistors. Furthermore, since resistive element 11 (as well as individual resistive element 15 and sheet-shaped resistive element 11a) and electrodes 13 are made of metal, a resistance as low as 1 to 10 mΩ can be achieved. In addition, the absence of an insulating substrate allows the resistor to be small in thickness. In addition, resistive element 11 (as well as sheet-shaped resistive element 11a) has a thickness from 50 to 500 μm, and electrodes 13 have a thickness from 10 to 100 μm.

In the case of giving a higher priority to the ease of pouring insulating film 12 into the space between adjacent belt-shaped electrodes 13 than the accuracy of resistance value, it is possible to form electrodes 13 without exposure, as in the second exemplary embodiment.

In the same manner as in the first exemplary embodiment, electrodes 13 do not overlap protective film 12 in the second and third exemplary embodiments.

As described above, the resistor and its manufacturing method according to the present disclosure prevents a decrease in the connection reliability between the resistive element and the electrodes, and is particularly useful as a compact low-resistance resistor used to detect the current values of various electronic apparatuses.

What is claimed is:

1. A resistor comprising:
   a resistive element made of a metal plate;
   a protective film formed on a first surface of the resistive element; and
   a pair of electrodes separated from each other with the protective film therebetween and formed at both ends of the first surface of the resistive element,
   wherein the pair of electrodes are formed by printing paste containing resin and metal powder contained in the resin.

2. The resistor according to claim 1,
   wherein the resistive element is made of an alloy containing a same metal as a metal composing the electrodes.

3. The resistor according to claim 1,
   wherein the protective film has an thickness as same as those of the pair of electrodes, on the first surface of the resistive element.

4. The resistor according to claim 1,
   wherein the metal contained in the electrode and the metal composing the resistive element diffuse each other at an interface between the electrode and the resistive element.

5. A method of manufacturing a resistor, the method comprising:
   forming a plurality of electrodes by printing metal powder-containing paste at space intervals on an upper surface of a resistive element made of metal plate;
   forming a protective film so as to cover the upper surface of the resistive element and upper surfaces of the electrodes; and
   grinding the protective film until the electrodes are exposed.

6. The method of manufacturing a resistor according to claim 5, wherein
   wherein in said forming the protective film, the protective film is seamlessly formed so as to cover the entire upper surface of the resistive element and upper surfaces of the electrodes, and
   wherein in said grinding the protective film, the protective film is grinded until the electrodes are exposed.

7. A method of manufacturing a resistor, the method comprising:
   forming a resist on an upper surface of a sheet-shaped resistive element made of metal;
   forming a plurality of belt-shaped spaces in the resist;
   forming belt-shaped electrodes on the upper surface of the sheet-shaped resistive element by printing metal paste in the spaces;
   removing the resist;
   forming an insulating film so as to cover a part, which is exposed from the belt-shaped electrodes, of the sheet-shaped resistive element; and
   cutting the sheet-shaped resistive element with the belt-shaped electrodes and the insulating film into individual resistive elements,
   wherein an exposure mask having a plurality of belt-shaped openings is placed on the resist, and the resist is exposed through the exposure mask and removed partially in the shape of belts when forming the belt-shaped spaces in the resist.

* * * * *